Figure 1:
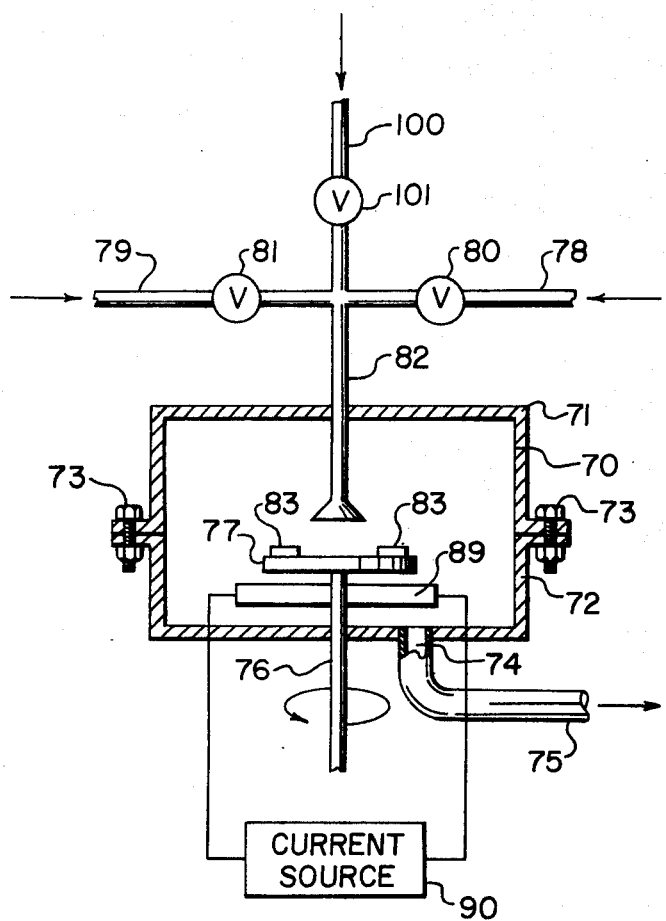

United States Patent [19]
Post et al.

[11] 3,964,937
[45] June 22, 1976

[54] METHOD OF MAKING A COMPOSITE COATING

[75] Inventors: Robert C. Post, Dallas; Allen W. McCullough, Irving; James H. McClure, Dallas, all of Tex.

[73] Assignee: Materials Technology Corporation, Dallas, Tex.

[22] Filed: Dec. 20, 1974

[21] Appl. No.: 534,698

Related U.S. Application Data

[62] Division of Ser. No. 387,665, Aug. 13, 1973, Pat. No. 3,874,900.

[52] U.S. Cl. .............................. 148/6.35; 29/195; 29/198; 148/6; 148/16.5; 148/16.6; 148/20.3; 148/31.5; 427/248; 427/249
[51] Int. Cl.² ................................... C23C 11/08
[58] Field of Search .............. 117/69, 71 M, 106 A; 29/195 A, 198; 148/6, 6.3, 6.35, 16.5, 16.6, 20.3, 31.5; 427/248, 249, 253, 419; 51/295, 307

[56] References Cited

UNITED STATES PATENTS

| | | | |
|---|---|---|---|
| 3,492,153 | 1/1970 | Ervin | 427/249 |
| 3,656,995 | 4/1972 | Reedy | 427/428 |
| 3,684,585 | 8/1972 | Stroup | 148/31.5 X |
| 3,784,402 | 1/1974 | Reedy | 427/428 |
| 3,787,223 | 1/1974 | Reedy | 148/31.5 X |

*Primary Examiner*—C. Lovell
*Attorney, Agent, or Firm*—Jack A. Kanz

[57] ABSTRACT

Disclosed is a composite coating for wear surfaces comprising a layer of vapor deposited titanium nitride overlying a layer of titanium carbide. The composite coating is formed by successive chemical vapor depositions of titanium carbide and titanium nitride on a heated substrate.

4 Claims, 2 Drawing Figures

METHOD OF MAKING A COMPOSITE COATING

This application is a division of co-pending application of Robert C. Post, Allen W. McCullough and James H. McClure entitled Article Coated with Titanium Carbide and Titanium Nitride, Ser. No. 387,665, filed Aug. 13, 1973 now U.S. Pat. No. 3,874,900.

This invention relates to coatings for wear surfaces. More particularly it relates to composite coatings of titanium carbide and titanium nitride for use as protective coatings on wear surfaces of metal and composite parts such as cutting tools, dies and the like, and methods for making same.

Many machine parts, tools, dies and the like include wear surfaces which, in normal use, are subject to abrasion and excessive wear. To resist excessive wear such wear surfaces are conventionally made of hard materials such as hardened or treated steel or composite materials such as cemented carbides wherein a material such as tungsten carbide is dispersed in or filled with cobalt. Such cobalt cemented carbides have become conventional for use as cutting tools and the like.

In more sophisticated applications extremely hard coatings of materials such as titanium carbide have been applied to wear surfaces to further enhance their ability to withstand friction, abrasion and wear.

U.S. Pat. No. 3,684,585 to Ralph F. Stroup et al. discloses a method of forming a titanium carbide coating on metal or composite substrates to produce parts with extremely hard wear resistant surfaces. The use of material such as titanium carbide, having a hardness of almost one-half that of diamond, produces extremely hard wear surfaces and greatly enhances the useful life of machine tools and the like.

It has now been discovered that the useful life of titanium carbide coated wear surfaces can be even further extended by applying a coating of titanium nitride thereover. Even though the hardness of titanium nitride is substantially less than that of titanium carbide, the combined coating exhibits properties far superior to those of titanium carbide alone or titanium nitride alone.

In accordance with the present invention a composite coating is formed comprising a layer of titanium carbide over which is formed a contiguous coating of titanium nitride. Both coatings may advantageously be formed in a consecutive process using the same equipment, producing a composite coating which is even more wear resistant than titanium carbide coatings alone. Since the titanium nitride coating may be formed in the same operation, the composite coating of this invention may be produced with little additional expense or time and only a minimum of additional equipment. Furthermore, the total thickness of the composite coating need be no more than the thickness of a titanium carbide coating previously used for the same purpose.

Figure 2:
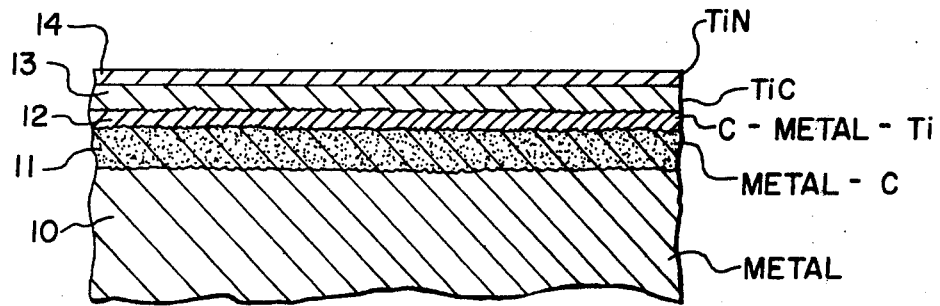

The cost of forming the composite coating is only slightly more than that of forming titanium carbide coatings. The wear surface produced, however, exhibits vastly superior qualities even though titanium nitride is not as hard as titanium carbide. Furthermore, the composite coating has been found to be suitable for use on cutting tools and dies for copper-containing materials, such as bronze, without encountering the copper collecting problems normally associated with conventional tools and other hard coatings. Other features and advantages of the invention will become more readily understood from the following detailed description taken in connection with the appended claims and attached drawings in which:

FIG. 1 is a schematic drawing of a process system and apparatus for producing composite coatings in accordance with the preferred method of the invention; and FIG. 2 is a diagrammatic illustration of a sectional view of a portion of a metal substrate coated with the composite coating of the invention.

The invention disclosed herein contemplates the formation of adherent coatings of titanium nitride on titanium carbide. Accordingly, a continuous coating or homogeneous substrate of titanium carbide is required. Titanium carbide, formed by any suitable process, is considered an acceptable starting material. However, the formation of dense adherent titanium carbide requires considerable skill, equipment and technical ability. For a suitable method for producing adherent coatings of titanium carbide on metal or composite substrates, reference is made to the above-mentioned U.S. Pat. No. 3,684,585 wherein adherent coatings of titanium carbide are formed by first carburizing the surface of the substrate and thereafter depositing a coating of titanium carbide by vapor phase deposition using a volatile hydrocarbon and titanium halide. In practicing the preferred embodiment of the present invention similar apparatus is used. Accordingly, the invention will be disclosed with particular reference to the process disclosed in U.S. Pat. No. 3,684,585.

Apparatus suitable for practicing the invention is illustrated in FIG. 1. The apparatus includes a sealable deposition chamber 70 comprised of an upper portion 71 and a lower portion 72. The upper and lower portions are removeably secured together by conventional means such as bolts 73, clamps or the like. Chamber 70 has an exhaust port 74 connected to an exhaust line 75 which is in turn connected to a conventional vacuum pump or the like for removing gases from the deposition chamber. A rotatable table 77 is mounted on a shaft 76 which passes transversely through the bottom of the deposition chamber 70 and is adapted for rotation by conventional means. Rotatable table 77 is preferably constructed of a relatively inert material such as graphite or the like while the deposition chamber may be constructed of steel or any other suitable material.

A radiant heater 89 is secured below rotatable table 77 and interconnected with a suitable power source 90 for heating the material in the deposition chamber. Reactants are injected into the reaction chamber through lines 78, 79 and 100 by way of control valves 80, 81 and 101, respectively, and injected into the deposition chamber by way of nozzle 82. Nozzle 82 projects into the upper portion of the deposition chamber and directs the reactants toward the surface of the rotatable table 77.

The substrate workpieces 83 to be coated are positioned on rotatable table 77 as illustrated in FIG. 1. Alternatively, workpieces 83 may be supported on suitable racks, hangers or the like within the deposition chamber.

The deposition chamber is closed and sealed, evacuated and refilled with purified hydrogen through inlet 79, valve 81 and nozzle 82. When the chamber 70 is filled with dry hydrogen exhaust port 74 is opened and hydrogen allowed to flow through the chamber 70 at a rate of about 25 to about 50 liters per minute.

With hydrogen flowing through the chamber 70 at essentially atmospheric pressure heater 89 is activated by passing current therethrough from current source 90. The workpiece 83 is heated to a temperature between about 900° and 1200°C. in the flowing hydrogen and maintained at this temperature for about 15 to about 30 minutes to assure complete cleaning and outgasing of the workpieces. Throughout the cleaning and following deposition process, rotatable table 77 is rotated at a rate of about 1 to about 15 rpm and is uniformly heated by radiant energy from the heater 89. All workpieces 83 are therefore maintained at a relatively constant temperature.

After the workpieces have been thoroughly cleaned as described above, a mixture of a volatile hydrocarbon and hydrogen is introduced into the chamber to carburize the surface of the workpieces 83. In the preferred practice of the invention the ratio of hydrocarbon to hydrogen is about 0.01:1 carbon to hydrogen (1 carbon atom per 100 $H_2$ molecules). The hydrocarbon is cracked or decomposed at the heated workpiece surface depositing pure carbon thereon. The carbon deposited on the workpiece diffuses into the surface, thereby carburizing the workpiece surface. The above condition is maintained for about 5 to about 45 minutes whereby a carburized layer is formed adjacent the surface of the workpiece which is approximately 0.005 inch thick, depending on the rate of diffusion of the carbon into the material of the workpiece and the temperature of the workpiece.

It will be readily understood that various volatile hydrocarbons may be used in the carburization process described. It has been found convenient, however, to use a mixture of hydrogen and monochlorobenzene for the carburization step. This gas mixture may be used as the hydrocarbon source in the subsequent deposition process by simply adjusting the monochlorobenzene concentration and the hydrogen flow rate.

After the carburization step is completed a reactant gas containing hydrogen and monochlorobenzene is introduced into the chamber 70 through line 79, valve 81 and nozzle 82. Simultaneously with the introduction of hydrogen and monochlorobenzene gas, a mixture of hydrogen and titanium tetrachloride ($TiCl_4$) is introduced through line 78, valve 80 and into nozzle 82.

In the preferred method, the composition of reactant gas entering the deposition chamber 70 through nozzle 82 is approximately 0.75 to about 1.5 mole percent $TiCl_4$, 0.125 to about 0.25 mole percent monochlorobenzene, and the remainder hydrogen.

It will be understood that within the gas composition ranges given it is preferred to introduce sufficient hydrocarbon to maintain at least a stoichiometric ratio of carbon to titanium in the reactant gas stream. Therefore it will be apparent that the mole ratio of $C_6H_5Cl$ to $TiCl_4$ should be at least 1:6 under these preferred conditions. Throughout the deposition process the temperature of the workpiece 83 is maintained at a temperature between about 900°C. and about 1200°C. Under these conditions a uniform, dense coating of titanium carbide is formed on the workpiece surface at a rate of about 0.0001 to about 0.001 inch per hour.

To produce the preferred embodiment of composite coating of the present invention, the above described titanium carbide deposition process is allowed to proceed for a time sufficient to form a coating of titanium carbide approximately 0.00020 inch thick. Valve 81 is then closed, stopping the flow of hydrogen and hydrocarbon mixture through line 79 into nozzle 82. Valve 101 is simultaneously opened admitting nitrogen through line 100 into nozzle 82. The flow of hydrogen and $TiCl_4$ mixture through line 78 and valve 80 is continued. The flow of nitrogen is adjusted to produce a mixture of nitrogen and $TiCl_4$ in hydrogen in the nozzle 82 comprising titanium and at least enough nitrogen to provide stoichiometric quantities of nitrogen and titanium. In the preferred embodiment, sufficient nitrogen is admitted into nozzle 82 to form a gaseous mixture wherein the nitrogen is about two to about ten times the amount required for a stoichiometric mixture of nitrogen and titanium. With the exception of the change in reactants, the reaction conditions remain the same.

Under these conditions a dense, adherent, continuous coating of titanium nitride is formed over the titanium carbide coating. A thickness of 0.00005 inch is obtained in about 10 to about 30 minutes. If desired, reaction temperatures may be decreased for the titanium nitride deposition reaction.

In the process described a composite coating is formed on the metal substrate. The composite coating comprises a layer of titanium carbide and a layer of titanium nitride. In forming the titanium carbide layer according to the process described, an interlayer of carbon, titanium, titanium carbide and metal of the substrate is formed which adherently bonds the titanium carbide layer to the substrate. The formation of the interlayer forms no part of the present invention but is described herein to illustrate the preferred process for producing the titanium carbide portion of the composite coating of the invention. The general composition of the composite coating formed as described above is illustrated in FIG. 2 wherein the metal substrate is illustrated at 10. A carbon-rich layer 11 is formed in the surface of the substrate. Since the carbon is diffused and dissolved in the surface of the substrate, the transition from the virgin metal to the carburized surface is not clear and distinct, but is a gradual transition. Likewise, the formation of the ternary interlayer 12, which is formed by both titanium from the gas phase and metal and carbon from the solid phase, is merely a change in the composition of the surface of the original substrate and the transition from region 11 to region 12 is likewise not clear and distinct.

As titanium precipitates from the vapor phase reaction and enters the interlayer 12, a titanium carbide layer 13 forms on the surface of the interlayer. Since the transition from the interlayer to pure titanium carbide is gradual, the precise transition is difficult to establish. It should be noted, however, that upon inspection of a section of a substrate coated as described herein, each of the layers 11, 12 and 13 are clearly observed. Furthermore, while the exact point of transition from one layer to the other is not easily determined, it should be noted that layer 13 is a layer of pure, dense titanium carbide and the surface of layer 13 is a physical reproduction of the original surface of the metal substrate. Therefore, if the metal substrate was originally a smooth polished surface, the surface of the titanium carbide layer 13 formed will also be a smooth polished surface.

The titanium nitride layer 14 is formed adjacent and contiguous with layer 13. The titanium nitride layer is adherently bonded to the titanium carbide layer and duplicates the physical characteristics of the original surface.

Conventional cutting tools with the composite coatings described formed thereon have been found to exhibit qualities superior to those of the same tools without coatings or with coatings of titanium carbide alone. The superior qualities are quite surprising since the hardness of titanium carbide on the Knoop scale is 3200, about one-half that of diamond, while the hardness of titanium nitride is 1700. Even though titanium carbide is considerably harder than titanium nitride, wear surfaces with the composite coating of this invention consistently exhibit performance characteristics superior to those with only titanium carbide coatings.

To demonstrate the relative qualities of the coatings, three sets of standard C2 grade inserts were divided into four groups each. No coating was applied to the first group. A titanium carbide coating 0.00025 inch thick was applied to the second group in each set by the process described hereinabove. A coating of titanium nitride 0.00025 inch thick was applied to the third group in each set by altering the process described above to eliminate the introduction of a hydrocarbon. The substrates were heated and cleaned as described above. Then the nitrogen and TiCl$_4$ in hydrogen mixture were injected into the reactor simultaneously for a time sufficient to form a 0.00025 inch thick coating of titanium nitride directly on the surface of the substrate.

The fourth group in each set was coated with the composite coating of this invention. The thickness of the combined titanium carbide and titanium nitride coating was also 0.00025 inch. The inserts in each group were then used under identical conditions to machine cast iron parts. The results are tabulated in the following examples:

EXAMPLE I

A set of standard SNU 644 inserts was used in a facing operation. Inserts from each group in the set were tested under identical conditions with a cutting speed of 520 down to 430 surface feet per minute, a 0.25 inch depth of cut and 0.025 inch feed per revolution. The average life of inserts from each group, expressed in terms of parts cut per tool corner, was found to be:

| Group 1 | (no coating) | 2 |
| Group 2 | (titanium carbide coating) | 25 |
| Group 3 | (titanium nitride coating) | 7 |
| Group 4 | (composite coating) | 30 |

EXAMPLE II

A set of standard TNMG 434 inserts was used in a boring operation. Inserts from each group in the set were tested under identical conditions with a cutting speed of 430 surface feet per minute, a 0.125 inch depth of cut and 0.025 inch feed per revolution. The average life of inserts from each group, expressed in terms of parts cut per tool corner, was found to be:

| Group 1 | (no coating) | 0 |
| Group 2 | (titanium carbide coating) | 15 |
| Group 3 | (titanium nitride coating) | 0 |
| Group 4 | (composite coating) | 20 |

EXAMPLE III

A set of standard TNU 533 inserts was used in a facing operation. Inserts from each group in the set were tested under identical conditions with a cutting speed of 630 down to 80 surface feet per minute, a 0.125 inch depth of cut and 0.050 inch feed per revolution. The average life of inserts from each group, expressed in terms of parts cut per tool corner, was found to be:

| Group 1 | (no coating) | 0 |
| Group 2 | (titanium carbide coating) | 30 |
| Group 3 | (titanium nitride coating) | 4 |
| Group 4 | (composite coating) | 40 |

It should be noted that in each of the examples given the uncoated inserts, although conventionally used for the operation discussed, failed rapidly because of the feed rates and speeds used. However, the titanium carbide coated inserts performed satisfactorily. Likewise, in example II the inserts coated with titanium nitride alone failed. In each example, however, addition of the titanium nitride coating to the titanium carbide coating substantially increased the useful life of the tool while tools coated with titanium nitride alone either failed completely or exhibited performance characteristics far inferior to those coated with the composite coating.

While the inserts used in the examples cited employed composite layers including a titanium carbide layer formed by the process disclosed in U.S. Pat. No. 3,684,585, it is to be understood that the invention is not so limited. Any surface of suitable titanium carbide may be coated with titanium nitride to produce the composite coatings of the invention.

From the examples cited, it will be observed that the composite coating of the invention greatly enhances the life of wear surfaces subjected to extreme wear, abrasion and heat. Another quite unexpected advantage has also been observed. Uncoated wear surfaces of conventional tools such as dies, cutting tools and the like as well as tools coated with hard materials such as titanium carbide, frequently encounter difficulties when working materials containing copper. For example, dies for working copper-containing materials and cutting tools for working copper-containing materials such as bronze tend to collect copper on the wear surface. The copper appears to stick to the wear surface and the tool often tends to weld to the work material, particularly when the tool is used in high speed operations. It has been discovered, however, that the copper problem is eliminated or substantially reduced when the wear surface is protected with a coating of titanium nitride overlying a coating of titanium carbide as described hereinabove. Accordingly, the composite coating of this invention not only extends the useful life of wear surfaces, but also permits use of such wear surfaces in high speed operations and in dies for applications heretofore unachieveable.

It will be observed that in the specific examples cited, the titanium nitride coating was only 0.00005 inch thick while the underlying titanium carbide coating was 0.00020 inch thick. The invention, however, is not to be construed as limited to any particular thickness of each portion of the composite layer or the relative thicknesses of each layer. Those skilled in the art will recognize that the thicknesses of the layers in the composite coating may be varied as desired or dictated by specific use intended, relative cost of production and the like.

While the invention has been described with particular reference to specific embodiments thereof, it is to be understood that the forms of the invention shown and described in detail are to be taken as preferred embodiments of same, and that various changes and modifications may be resorted to without departing from the spirit and scope of the invention as defined by the amended claims.

What is claimed is:

1. The method of forming a coating on the wear surface of a composite metal tool comprising the steps of:
   a. carburizing the wear surface of said tool by depositing carbon thereon in amounts sufficient to form a surface layer enriched in carbon;
   b. reacting a titanium halide with a volatile hydrocarbon to form an interlayer at the surface of said tool, said interlayer comprising titanium, carbon and the material of said tool;
   c. depositing a coating of titanium carbide on said interlayer by reacting a volatile hydrocarbon and a titanium halide in hydrogen at the surface of said interlayer; and
   d. depositing a coating of titanium nitride on said coating of titanium carbide by reacting nitrogen and a titanium halide in hydrogen at the surface of said titanium carbide.

2. The method of forming a composite coating on the wear surface of a metal tool comprising the steps of:
   a. heating the tool in a reactor to a temperature range of 900°C to about 1200°C and carburizing the wear surface of said tool by depositing carbon thereon in amounts sufficient to form a surface layer enriched in carbon;
   b. reacting a titanium halide with a volatile hydrocarbon at a temperature in the range of 900°C to about 1200°C to form an interlayer at the surface of said tool, said interlayer comprising titanium, carbon and the material of said tool;
   c. depositing a coating of titanium carbide on said interlayer by reacting a volatile hydrocarbon and a titanium halide in hydrogen at the surface of said interlayer at a temperature in the range of 900°C to about 1200°C and;
   d. injecting a gaseous mixture of hydrogen, nitrogen and titanium halide into said reactor at a temperature in the range of 900°C to about 1200°C to form a coating of titanium nitride on said titanium carbide.

3. The method set forth in claim 2 wherein the ratio of nitrogen to titanium in said gaseous mixture is at least 1:1.

4. The method set forth in claim 2 wherein the ratio of nitrogen to titanium in said gaseous mixture is from about 2:1 to about 10:1.

* * * * *